(12) United States Patent
Tomura et al.

(10) Patent No.: US 11,380,555 B2
(45) Date of Patent: Jul. 5, 2022

(54) ETCHING METHOD AND ETCHING APPARATUS

(71) Applicant: Tokyo Electron Limited, Tokyo (JP)

(72) Inventors: Maju Tomura, Miyagi (JP); Sho Kumakura, Miyagi (JP); Hironari Sasagawa, Miyagi (JP); Yoshihide Kihara, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/953,369

(22) Filed: Nov. 20, 2020

(65) Prior Publication Data

US 2021/0159084 A1    May 27, 2021

(30) Foreign Application Priority Data

Nov. 25, 2019   (JP) .............................. JP2019-212241

(51) Int. Cl.
*H01L 21/311*   (2006.01)
*H01J 37/32*    (2006.01)

(52) U.S. Cl.
CPC .. *H01L 21/31116* (2013.01); *H01J 37/32724* (2013.01); *H01L 21/31144* (2013.01); *H01J 2237/3341* (2013.01)

(58) Field of Classification Search
CPC ......... H01L 21/31116; H01L 21/31144; H01L 21/6831; H01L 21/67103; H01L 21/3065; H01L 21/31138; H01L 21/02115; H01L 21/0228; H01L 21/67069; H01J 37/32724; H01J 2237/3341; H01J 37/32449; H01J 2237/334; H01J 2237/3321

See application file for complete search history.

(56) References Cited

U.S. PATENT DOCUMENTS

| 5,605,600 A * | 2/1997 | Muller ................ H01L 21/3065 216/37 |
| 2005/0211385 A1 * | 9/2005 | Benjamin ......... H01L 21/67069 156/345.52 |
| 2010/0173494 A1 | 7/2010 | Kobrin |

* cited by examiner

*Primary Examiner* — Shamim Ahmed
(74) *Attorney, Agent, or Firm* — Xsensus LLP

(57) ABSTRACT

A technique improves pattern features formed by etching and the uniformity of the features across the surface of a substrate. An etching method includes steps a), b), c), d), and e). Step a) includes placing, on a support, a substrate including a target film. Step b) includes partially etching the target film and forming a recess. Step c) includes setting the temperature of the support at a first temperature, and forming, on a sidewall of the recess, a first film having a first film thickness distribution. Step d) includes partially further etching the target film having the first film formed on the target film. Step e) includes setting the temperature of the support at a second temperature different from the first temperature, and forming, on the sidewall of the recess, a second film having a second film thickness distribution different from the first film thickness distribution.

19 Claims, 11 Drawing Sheets

| Processing count | Support temperature | Processing condition |
|---|---|---|
| 1 to 10 | 10 °C | ... |
| 11 to 20 | 20 °C | ... |
| 21 to 30 | 30 °C | ... |
| ... | | |
| ... | | |

FIG. 8

| Condition No. | Support temperature | | | Processing condition |
|---|---|---|---|---|
| | First zone | Second zone | Third zone | |
| 1 | 10 °C | 60 °C | 30 °C | ... |
| 2 | T1 | T2 | T3 | ... |
| 3 | T1 | T1 | T2 | ... |
| 4 | T1 | T1 | T1 | ... |
| ... | ... | ... | ... | ... |

ETCHING METHOD AND ETCHING APPARATUS

CROSS-REFERENCE TO RELATED APPLICATION

This application claims priority to Japanese Patent Application No. 2019-212241 filed on Nov. 25, 2019, the entire disclosure of which is incorporated herein by reference.

BACKGROUND

Technical Field

The present disclosure relates to an etching method and an etching apparatus.

Description of the Background

For semiconductor devices that are integrated further in the vertical direction in addition to the horizontal direction, patterns are formed with higher aspect ratios during their manufacturing processes. In 3D NAND manufacturing processes, for example, channel holes are formed in a direction through many metal wiring layers. For a 64-layer memory cell, channel holes are formed to provide an aspect ratio of as high as 45.

Various methods have been developed to accurately form patterns with a high aspect ratio. An example technique is to control the size of a pattern formed by semiconductor etching at the nanometer scale (Patent Literature 1). This technique uses a self-assembled monolayer (SAM) or a film formed by atomic layer deposition (ALD) as a passivation layer. The passivation layer is formed on a sidewall of a recess in the substrate. The substrate, or the bottom of the recess, is then etched to achieve high-accuracy anisotropic etching.

CITATION LIST

Patent Literature

Patent Literature 1: U.S. Patent Application Publication No. 2010/0173494

BRIEF SUMMARY

The present disclosure is directed to a technique for improving pattern features formed by etching or their uniformity across the surface of the substrate.

An etching method according to one aspect of the present disclosure includes steps a), b), c), d), and e). Step a) includes placing, on a support, a substrate including a target film. Step b) includes partially etching the target film and forming a recess. Step c) includes setting a temperature of the support at a first temperature, and forming, on a sidewall of the recess, a first film having a first film thickness distribution. Step d) includes partially further etching the target film having the first film formed on the target film. Step e) includes setting the temperature of the support at a second temperature different from the first temperature, and forming, on the sidewall of the recess, a second film having a second film thickness distribution different from the first film thickness distribution.

The exemplary technique according to the present disclosure improves pattern features formed by etching or their uniformity across the surface of the substrate.

BRIEF DESCRIPTION OF DRAWINGS

FIG. 8 is a diagram showing exemplary conditions used with the etching method according to the second embodiment.

DETAILED DESCRIPTION

Figure 1:
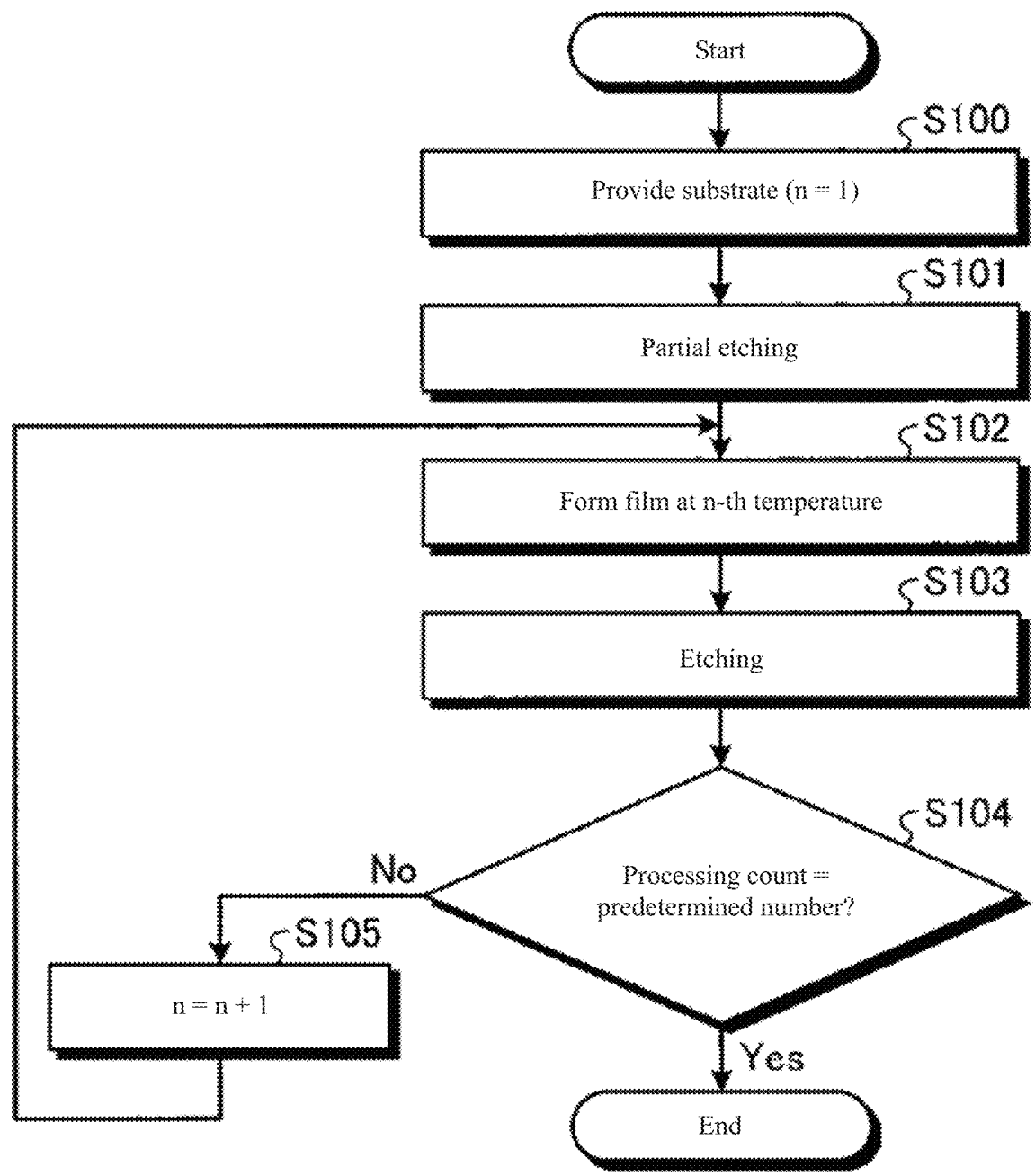
FIG. 1 is a flowchart of an exemplary etching method according to a first embodiment.

Embodiments of the present disclosure will now be described with reference to the drawings. The present embodiments are not limiting. Additionally, the techniques described in the embodiments may be combined as appropriate, unless any contradiction arises in the processing. In the drawings, similar or corresponding components are indicated by like reference numerals. The embodiments are illustrated by way of example and not by way of limitation in the accompanying drawings that are not to scale unless otherwise indicated.

In the embodiments, a pattern formed on a substrate will be described by referring to a direction substantially perpendicular to the substrate surface as either the thickness direction or the vertical direction. A direction substantially parallel to the substrate surface is referred to as a lateral direction. For a substantially disk-shaped substrate, a direction from the disk center toward the circumference and parallel to the substrate surface is also referred to as a radial direction.

A pattern herein refers to any features formed on the substrate. The pattern collectively refers to holes, trenches, lines and spaces, masks, and any other features formed on the substrate. A recess in the pattern on the substrate refers to a portion recessed in the thickness direction of the substrate. A recess includes a sidewall defining its inner periphery, a bottom portion defining the bottom, and a top continuous with the sidewall and defining a substrate surface portion near the sidewall. Additionally, a space defined by the edge of the top is referred to as an opening. The term opening is also used to refer to the entire space surrounded by the bottom and the sidewall of the recess, or to any position of the space.

Feature Failures in Semiconductor Processes

Etching for forming a pattern with a high aspect ratio can involve feature failures. For example, a recess to be formed in the vertical direction (film thickness direction) can have an inner periphery expanding in the lateral direction, thus having feature failures. Such feature failures are called bowing.

Bowing often occurs directly below the interface between different types of films formed on a substrate. The etching rate differs between, for example, a target film to be etched and a layer serving as a mask for etching stacked on the target film. A portion of the target film that meets the mask is etched more, thus forming an opening that expands in the lateral direction directly below the mask.

Bowing may also occur near the bottom of the recess in the substrate. This may result from excessive etching of the sidewall with ions bouncing and colliding against the sidewall of the recess through, for example, a distorted mask.

In addition to bowing, the pattern may taper in the depth direction. This can occur seemingly because less etchant reaches a deeper portion of the pattern. To reduce such feature failures, a protective film is to be formed at a controlled position with a controlled thickness.

Flowchart of Exemplary Etching Method According to First Embodiment

FIG. 1 is a flowchart of an exemplary etching method according to a first embodiment. With the etching method according to the first embodiment, at least one of the position or the thickness of a film formed on a substrate is controlled by controlling the temperature of a support onto which the substrate is placed.

First, a substrate is provided (step S100). For example, the substrate including a target film and a mask on the target film is provided. The substrate is loaded into a reaction chamber accommodating the support, and is placed onto the support. The substrate placed on the support undergoes multiple cycles of processing. In FIG. 1, n indicates the number of processing cycles, and n is 1 at the start of the processing.

The target film is partially etched (step S101). This partial etching forms a pattern including a recess in the substrate. In step S101, an etching gas is supplied into the reaction chamber and plasma is generated. Ions contained in the plasma are drawn into the target film, thus etching the film.

This is followed by controlling the temperature of the substrate and the temperature of the support onto which the substrate is placed at an n-th temperature (for the first cycle, the first temperature) to form an n-th film on the recess (step S102). The n-th film has an n-th film thickness distribution corresponding to the n-th temperature. During the first cycle of film deposition, for example, the temperature of the support is controlled at the first temperature. A first film having a first film thickness distribution is then formed. The target film having the first film on it is partially further etched (step S103).

This is then followed by determining whether the processing count reaches a predetermined number (step S104). When the processing count reaches the predetermined number (Yes in step S104), the processing ends. When the processing count has not reached the predetermined number (No in step S104), the processing count is updated (n=n+1 in step S105), and the processing returns to step S102. When, for example, the predetermined number is 10 and the processing count is 1, the processing returns to step S102, in which the second cycle of film deposition is performed. During the second cycle of film deposition, in step S102, the support is controlled at the second temperature, and a second film having a second film thickness distribution is formed.

The processing is thereafter repeated until the processing count reaches the predetermined number. Once the processing count reaches the predetermined number, the processing ends.

In the processing shown in FIG. 1, a single cycle of processing may include processes other than the film deposition (step S102) and the etching (step S103). For example, the single cycle of processing may include, in addition to the etching in step S103, another etching process under a processing condition different from the condition used in step S103. For example, the single cycle of processing may include, in addition to the film deposition in step S102, another film deposition process under a processing condition different from the condition used in step S102. The etching in step S103 and the film deposition in step S102 may each include one or more steps. In step S103, for example, an etching process may be performed multiple times under the same or different processing conditions. In step S102, a film deposition process may be performed multiple times under the same or different processing conditions.

In the example shown in FIG. 1, the processing count is preset. In some embodiments, the pattern features may be measured after the film deposition in step S102, and the measurement results may be used to determine whether to perform the next processing and also to determine the temperature of the support. The processing count may be preset by calculating the number of times the etching process is to be performed to reach a desired etching depth (step S103).

Exemplary Pattern Formation in Embodiment

FIGS. 2A to 2D are diagrams each illustrating an exemplary pattern formed with an etching method according to one embodiment.

The film deposition in step S102 of FIG. 1 uses, for example, unsaturated atomic layer deposition (ALD), which is also called sub-conformal ALD. Before the pattern formation is described with reference to FIGS. 2A to 2D, ALD will now be described.

ALD usually includes four steps. A first reactant (also referred to as a precursor) is first introduced into the reaction chamber accommodating the substrate. A first material contained in the first reactant is adsorbed on the surface of the substrate. After the surface is covered with the first material, the reaction chamber is evacuated. Subsequently, a second reactant (also referred to as a reaction gas) containing a second material that reacts with the first material is introduced into the reaction chamber. The second material reacts with the first material on the substrate to form a film. The reaction of the second material with the first material on the surface ends to complete the film deposition. In ALD, predetermined materials are adsorbed on and react with substances present on the substrate surface in a self-limiting manner, thus forming films. Providing a sufficient processing duration typically allows ALD to achieve conformal film deposition.

In contrast, unsaturated ALD uses a processing condition under which materials are not completely adsorbed on or do not completely react with a substrate surface in a self-limiting manner. The processing can be in at least two modes described below.

(1) A precursor is adsorbed on the entire surface of the substrate. A reactant introduced thereafter is regulated from spreading over the entire surface of the substrate.

(2) A precursor is adsorbed only on a part of the surface of the substrate. A reactant introduced thereafter is deposited only on the part of the surface having the precursor adsorbed on it.

The etching method according to the first embodiment uses the technique (1) to control the position and the thickness of a film formed on a sidewall of a recess.

Figure 2A:
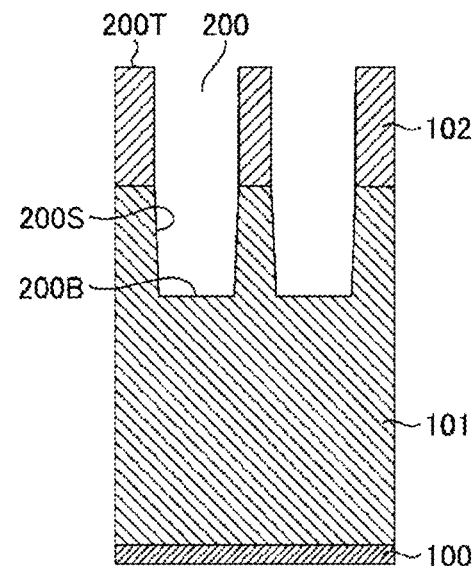
FIG. 2A is a diagram illustrating an exemplary pattern formed with the etching method according to the first embodiment.

FIG. 2A is a diagram illustrating a recess 200 in a first layer 101 on a substrate 100 and a second layer 102 on top of the first layer 101 formed through partial etching in step S101. In the example of FIG. 2A, the first layer 101 is a target film. The second layer 102 serves as a mask in etching the first layer 101. The recess 200 has a bottom 200B, a sidewall 200S, and a top 200T.

In FIG. 2A, the recess 200 gradually tapers from the lower end of the second layer 102 toward the bottom. In the state in FIG. 2A, further etching can proceed in the lateral direction and cause bowing. To reduce such bowing caused by etching, a protective film is formed, using unsaturated ALD, on the sidewall of the recess 200 partially etched in the first embodiment.

Figure 2B:
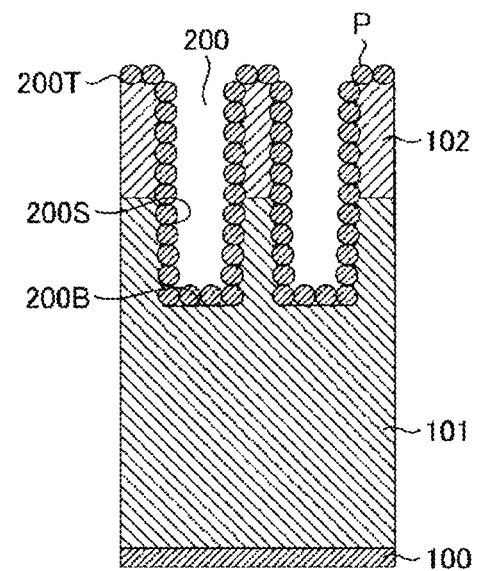
FIG. 2B is another diagram illustrating an exemplary pattern formed with the etching method according to the first embodiment.
Figure 2C:
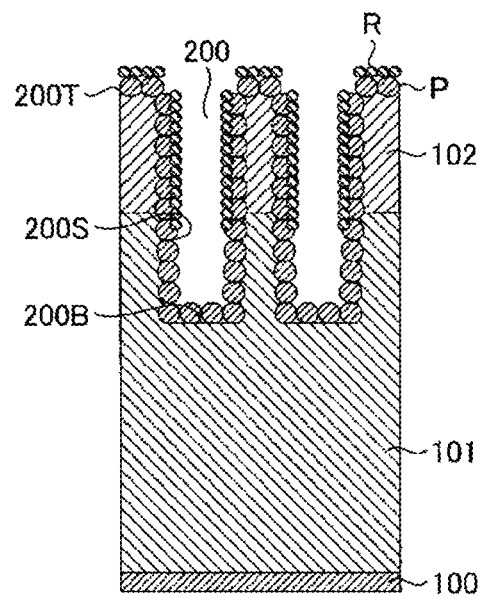
FIG. 2C is another diagram illustrating an exemplary pattern formed with the etching method according to the first embodiment.
Figure 2D:
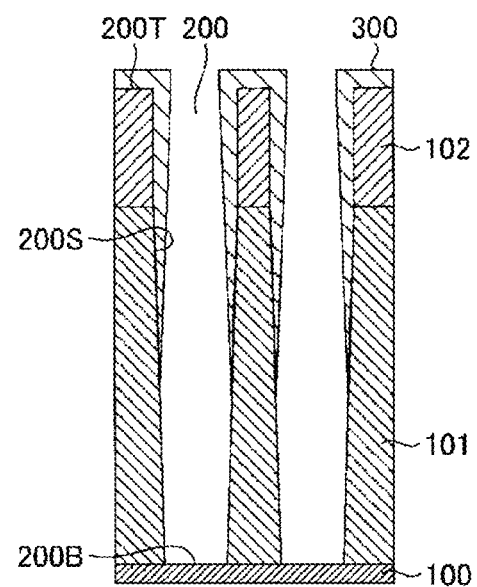
FIG. 2D is another diagram illustrating an exemplary pattern formed with the etching method according to the first embodiment.

A precursor P is first introduced into a reaction chamber accommodating a substrate. Providing a sufficient processing duration allows the precursor P to adsorb on the entire surface of the substrate (FIG. 2B). The adsorption of the precursor P may or may not involve plasma generation containing the precursor P. Once the precursor P is adsorbed, the gas in the reaction chamber is purged. A reactant R is then introduced into the reaction chamber, and undergoes a reaction with the precursor P adsorbed on the substrate surface. The reaction of the reactant R with the precursor P may be performed using a reaction gas containing the reactant R introduced into the reaction chamber, or using plasma generated with the reactant R to react with the precursor P (FIG. 2C). The introduced reactant R then reacts with the precursor P on the substrate, thus gradually forming a protective film 300 (refer to FIG. 2D) from above the second layer 102. Before the protective film 300 forms on the bottom 200B of the recess 200, the reactant R is purged from the reaction chamber. With this process, the protective film 300 can form simply on the upper portion of the first layer 101 and on the second layer 102 with the ALD method (FIG. 2C), rather than on the entire sidewall 200S of the recess 200. Repeating the processes shown in FIGS. 2A, 2B, and 2C yields the features shown in FIG. 2D.

In the example of FIGS. 2A to 2D, the reactant R is regulated from reaching the bottom 200B of the recess 200 to achieve unsaturated ALD. In another embodiment, the precursor P may be regulated from reaching the bottom 200B of the recess 200 (the precursor P may be regulated from adsorbing on the bottom 200B of the recess 200) to achieve unsaturated ALD.

Processing Conditions for Selective Adsorption and Reaction

With the etching method according to the first embodiment, as described above, the processing conditions are adjusted to allow a precursor to adsorb on or a reactant to react on a predetermined portion of a pattern. In one embodiment, the processing conditions are adjusted to allow the precursor to adsorb only on and the reactant to react only on the top and the upper portion of the sidewall of the recess.

The processing conditions adjustable for the etching method described above include the temperature of the support onto which the substrate is placed, the pressure in the reaction chamber, the flow rate and the introduction duration of the precursor, the flow rate and the introduction duration of the reactant, and the processing duration at each step. For the processing using plasma, the value of radio-frequency (RF) power applied to generate plasma may be adjusted.

The method in this example uses the temperature of the support to control the position and the thickness of a film to be formed.

Figure 3A:
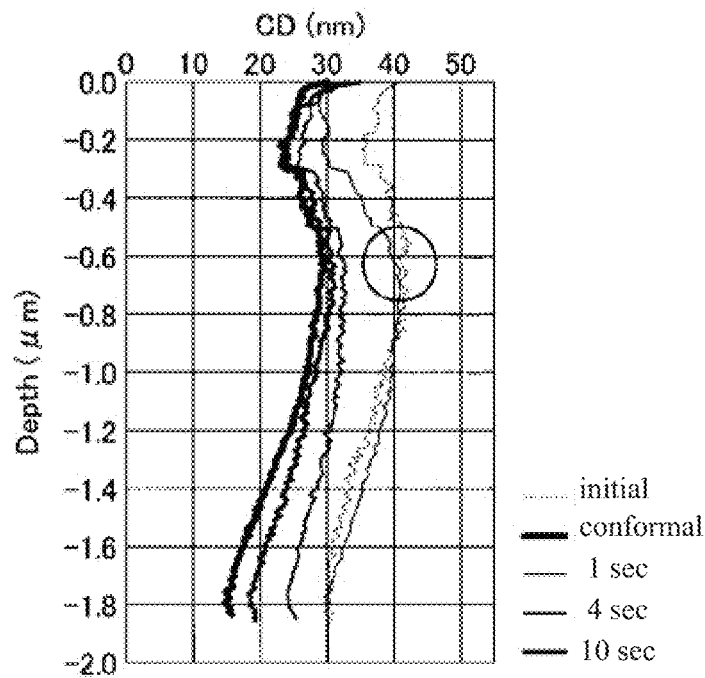
FIG. 3A is a graph showing experimental results obtained under a first temperature condition.
Figure 3B:
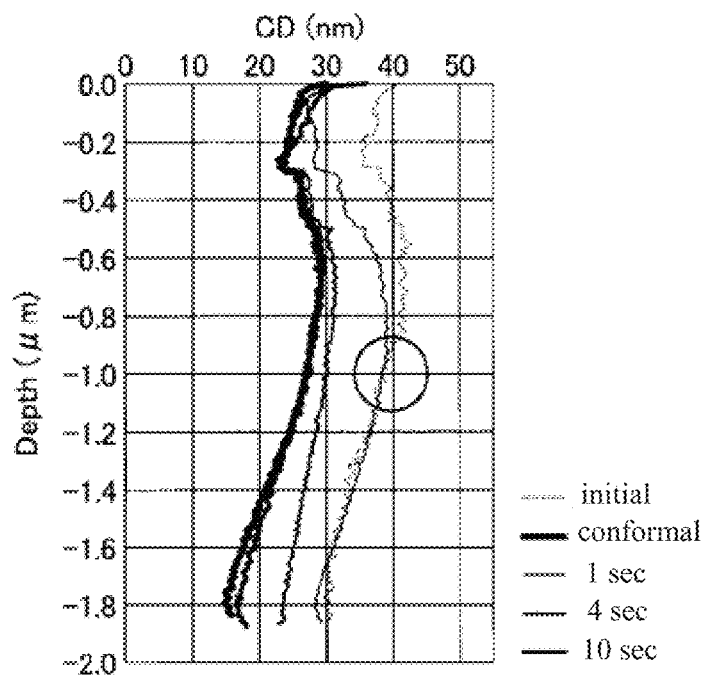
FIG. 3B is a graph showing experimental results obtained under a second temperature condition.

Adjusting Film Thickness and Film Deposition Position through Temperature Control FIG. 3A is a graph showing experimental results obtained under a first temperature condition. FIG. 3B is a graph showing experimental results obtained under a second temperature condition.

In the experiments shown in FIGS. 3A and 3B, the processing involving four steps, or introducing a precursor, purging, introducing a reactant, and purging, was performed in 35 cycles. To introduce the reactant, plasma formed from the reactant was used. The precursor was a silicon-containing gas. The reactant was an oxygen gas diluted with argon. A silicon oxide film was formed as the protective film. In these experiments, the support was set at two different temperatures when the reactant was introduced. The thickness and the position of the film formed were measured. The support was adjusted to the temperature of 10° C. in the experiment of FIG. 3A, and to the temperature of 60° C. in the experiment of FIG. 3B. The introduction duration of the reactant (generation duration of plasma) was set to four values: one second, four seconds, ten seconds, and the saturation completion duration (sufficient time for the reactant to saturate completely on the substrate surface).

In FIGS. 3A and 3B, the horizontal axis indicates the size of the opening, or the critical dimension (CD) of the recess formed in nanometers (nm), and the vertical axis indicates the depth of the recess in micrometers (μm). In the figures, the "initial" indicates the CD of the recess before the experiment was started, and the "conformal" indicates the CD when the processing was performed for the saturation completion duration. For conformal, films were formed with a substantially uniform thickness irrespective of the depth of the recess, as shown in FIGS. 3A and 3B.

Subsequently, the thickness of each film formed using the reactant for a different introduction duration was measured. As shown in the graph of FIG. 3A, the film formed using the reactant introduced for the introduction duration of 10 seconds was substantially conformal, although its thickness slightly decreases downward. With the reactant introduced for the introduction duration of 4 seconds, the resultant film has a thickness different from the film obtained for the reactant introduction duration of 10 seconds, and is thinner in a lower portion of the sidewall of the recess than the film obtained for the reactant introduction duration of 10 seconds. With the reactant introduced for the introduction duration of one second, the film was formed with the thickness gradually decreasing downward from the top of the recess to a depth of about 0.6 µm, but almost no film was formed in the portion lower than the depth of 0.6 µm.

As shown in the graph of FIG. 3B with the support set at 60° C., the film formed with the reactant introduced for the introduction duration of 10 seconds was substantially conformal, although the thickness slightly decreases downward. With the reactant for the introduction duration of 4 seconds, the resultant film has a thickness different from the film obtained for the reactant introduction duration of 10 seconds, and is thinner in a lower portion of the sidewall of the recess than the film obtained for the reactant introduction duration of 10 seconds. With the reactant introduced for the introduction duration of one second, the film was formed with the thickness gradually decreasing downward from the top of the recess to a depth of about 1 µm, but almost no film was formed in the portion lower than the depth of 1 µm.

With the introduction duration set shorter, a film can be formed with the thickness gradually decreasing in the film thickness direction of a pattern in either case. In particular, when the introduction duration of the reactant was set for one second, controlling the temperature of the support at 10° C. can reduce film deposition at positions lower than the depth of 0.6 µm, and controlling the temperature of the support at 60° C. can reduce film deposition at positions lower than the depth of 1 µm. As described above, the experiment results shown in FIGS. 3A and 3B reveal that changing the temperature of the support can adjust the thicknesses and the distributions of the resultant films.

Figures 4, 5:
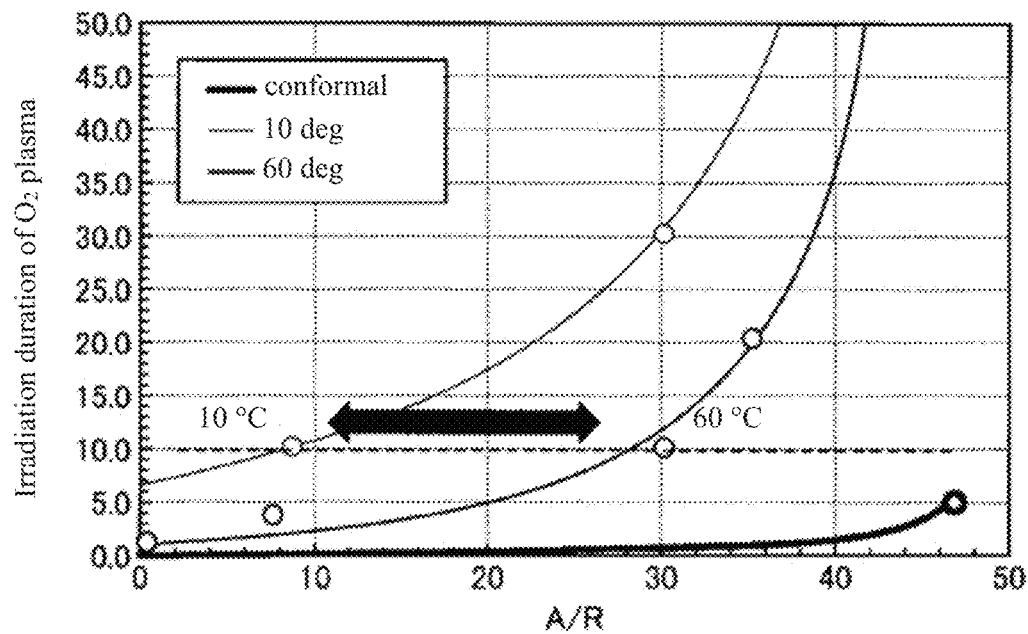
FIG. 4 is a graph showing the experimental results of FIGS. 3A and 3B together.
FIG. 5 is a diagram showing exemplary conditions used with the etching method according to the first embodiment.

FIG. 4 is a graph showing the experiment results of FIGS. 3A and 3B together. FIG. 4 specifically shows the experiment results combined on the graph showing the correspondence between the saturation duration of oxygen ($O_2$) plasma calculated using, for example, a diffusion equation and the aspect ratio.

As shown in FIG. 4, the lowermost position (A/R: aspect ratio) of the film formation varies in correspondence with changes in the introduction duration of the reactant (irradiation duration of $O_2$ plasma in this example). The lowermost position of the film formation differs by an aspect ratio of about 20 (portion indicated by the arrow in FIG. 4) between when the temperature of the support was set at 10° C. and when the temperature of the support was set at 60° C. Varying the temperature of the support within a range of 10° C. to 60° C., for example, can vary the lowermost position of film deposition within the aspect ratio range of about 20.

The etching method according to the first embodiment includes estimating the positions of possible feature failures, such as bowing and tapering, and forming a protective film in an area of possible feature failures. The etching method according to the first embodiment also includes adjusting the film deposition area by adjusting the temperature of the support onto which the substrate is placed. Additionally, the etching method according to the first embodiment may use unsaturated ALD to form a film with a thickness gradually decreasing in the film thickness direction. In the first embodiment, a protective film can be formed in an area (or at positions) of possible feature failures, such as tapering or bowing.

Example of Temperature Control

In FIG. 1, the setting temperature for the support was changed in the order of the first temperature and the second temperature in the film deposition (step S102) for ease of explanation. However, the setting temperature for the support may be changed for every cycle of film deposition, or may be unchanged. The setting temperature for the support may be the same over multiple cycles of film deposition. In other words, the first temperature and the second temperature may be the same, or the first temperature may be higher or lower than the second temperature, depending on the feature of a recess to be formed or on the processing conditions.

To form a recess with less feature failures that tapers to have a narrower opening from the top toward the bottom, for example, a protective film may be formed to have its film thickness decreasing from the top toward the bottom. The temperature of the support may be increased in the protective film formation (step S102 in FIG. 1) in accordance with an increase in the aspect ratio of the recess to form the protective film in a more downward area.

To reduce bowing in an upper portion of the recess, for example, the temperature of the support may be decreased in the protective film formation. This forms the protective film that covers a portion susceptible to bowing. To reduce bowing near the bottom of the recess, for example, the temperature of the support may be increased in the protective film formation.

In this manner, identifying the positions of possible feature failures and forming a protective film as thick as to cover such failure positions can improve the pattern features.

FIG. 5 is a diagram showing exemplary conditions used with the etching method according to the first embodiment. The conditions used in the example of FIG. 5 include the processing count, the support temperature, and the processing condition. The processing count refers to the number of cycles of processing performed, or the ordinal number. The support temperature refers to the setting temperature for the support for the corresponding cycle of film deposition (step S102 in FIG. 1). The processing condition refers to a processing condition other than the support temperature. The processing condition includes, for example, the type of precursor, the type of reactant, the flow rate, and the pressure in the reaction chamber. In the example of FIG. 5, the support was set at 10° C. for the processing count of 1 to 10, at 20° C. for the processing count of 11 to 20, and at 30° C. for the processing count of 21 to 30. Under the conditions shown in FIG. 5, the temperature of the support is increased as the processing proceeds to form a protective film at positions gradually downward. The etching method according to the first embodiment may use other temperature conditions. For example, the temperature of the support may be increased once and then decreased as the processing proceeds, or the temperature of the support may be decreased gradually.

Advantageous Effects of First Embodiment

The etching method according to the first embodiment includes steps a), b), c), d), and e). Step a) includes placing, on a support, a substrate including a target film. Step b) includes partially etching the target film and forming a recess. Step c) includes setting the temperature of the support at a first temperature, and forming, on a sidewall of the recess, a first film having a first film thickness distribution. Step d) includes partially further etching the target film having the first film formed on the target film. Step e) includes setting the temperature of the support at a second temperature different from the first temperature, and forming, on the sidewall of the recess, a second film having a second film thickness distribution different from the first film thickness distribution. The method according to the first embodiment can form the first film having the first film thickness distribution corresponding to the first temperature and the second film having the second film thickness distribution corresponding to the second temperature. The method according to the first embodiment can form a film with a film thickness distribution adjusted in accordance with the temperature. This improves the pattern features formed by semiconductor etching.

In the first embodiment, the first temperature differs from the second temperature. The first temperature may be lower than the second temperature. The first temperature may be higher than the second temperature. The method according to the first embodiment adjusts the temperature to adjust the film thickness distribution in accordance with pattern features formed by semiconductor etching. The method according to the first embodiment can form a protective film in an area of possible pattern feature failures resulting from etching.

In the first embodiment, other processing conditions may be adjusted to adjust the film thickness distribution, in addition to or instead of adjusting the temperature of the support. For example, step c) above may include steps c-1) and c-2). Step c-1) includes supplying a first reactant and causing the first reactant to be adsorbed on the sidewall of the recess. Step c-2) includes supplying a second reactant and causing the second reactant to react with the first reactant to forma film. Step e) above may also include steps e-1) and e-2). Step e-1) includes supplying a third reactant and causing the third reactant to be adsorbed on the sidewall of the recess. Step e-2) includes supplying a fourth reactant and causing the fourth reactant to react with the third reactant to form a film. Step c-2) may be performed for a processing duration different from a processing duration of e-2) to form the film to have at least one of a thickness or a position different from a thickness and a position of the film formed in e-2). Adjusting the processing conditions in this manner can further improve the pattern features formed by semiconductor etching.

In the first embodiment, the first film thickness distribution refers to the distribution of the film thicknesses varying across the thickness of the substrate. In the first embodiment, adjusting the film thickness distribution in the thickness direction of the substrate can improve the pattern features formed by etching.

In the first embodiment, a target film is an etching target film in steps b) and d), and a mask may be placed on top of the etching target film. The target film may be a silicon-containing film. The silicon-containing film may be a silicon-containing dielectric film. An example of the silicon-containing dielectric film includes a silicon oxide film ($SiO_x$). The mask on the target film may include a carbon-containing mask or a metal-containing mask. The target film and the mask may be silicon-containing films having different compositions.

In the first embodiment, steps b), c), d), and e) may be repeated until the aspect ratio of the recess reaches at least 40. Thus, the aspect ratio of the recess is adjustable in accordance with the type of semiconductor device to be manufactured or a process according to the first embodiment.

Second Embodiment

In the first embodiment, the setting temperature for the support is changed for each cycle of film deposition to adjust the position and the thickness of a film to be formed. In some embodiments, the support may have varying temperatures across its surface. In a second embodiment, an exemplary method including film deposition at temperatures varying across the surface of the support will be described.

Figure 6:
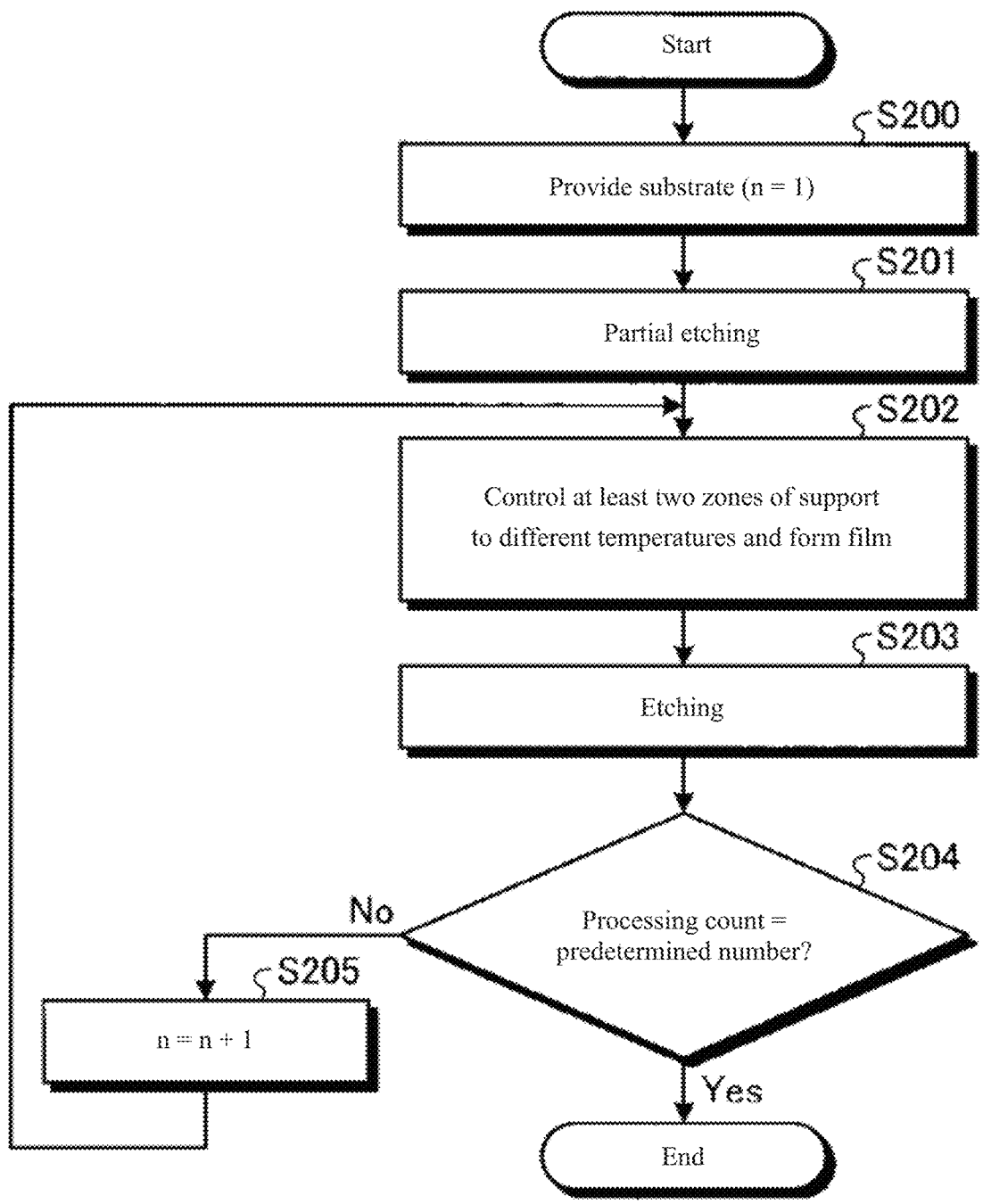
FIG. 6 is a flowchart of an exemplary etching method according to a second embodiment.

FIG. 6 is a flowchart of an exemplary etching method according to the second embodiment. First, a substrate is provided (step S200). For example, the substrate including a target film and a mask on the target film is provided. The substrate is loaded into a reaction chamber accommodating the support, and is placed onto the support. The substrate placed on the support undergoes multiple cycles of processing. In FIG. 6, n indicates the number of processing cycles, and n is 1 at the start of the processing. The processing in step S200 is the same as step S100 shown in FIG. 1.

The target film is partially etched (partial etching in step S201) to form a pattern including a recess on the substrate.

This is followed by controlling the temperature of the substrate and the temperature of the support onto which the substrate is placed. At least two of multiple zones of the support are controlled to different temperatures, and films (protective films) are formed (step S202). Each of the films has a different film thickness distribution corresponding to the control temperature of the corresponding zone of the support. For example, a first film formed in a first zone controlled at a relatively high temperature has a first film thickness distribution different from the second film thickness distribution of a second film formed in a second zone controlled at a relatively low temperature. For example, the lowermost position of the first film is lower than the lowermost position of the second film. The target film with the first film and the second film is partially further etched (step S203).

This is then followed by determining whether the processing count reaches a predetermined number (step S204). When the processing count reaches the predetermined number (Yes in step S204), the processing ends. The predetermined number is one or more. When the processing count has not reached the predetermined number (No in step S204), the processing count is updated (n=n+1 in step S205), and the processing returns to step S202 to perform film deposition. A set of temperatures used for multiple zones of the support in the n+1-th cycle of film deposition may differ from a set of temperatures used in the n-th cycle. The set of temperatures herein refers to multiple temperatures used for the respective zones.

The processing is thereafter repeated until the processing count reaches the predetermined number. Once the processing count reaches the predetermined number, the processing ends.

Zones with Controllable Temperatures

As described above, the support for each cycle of film deposition can be set to multiple temperatures in the second embodiment, rather than being set to a single temperature. The multiple temperatures correspond to the respective zones of the support. The zones of the support will now be described.

To vary the temperature of the support across its surface in the second embodiment, the support surface may have multiple zones defined to allow independent temperature control in each zone. The support accommodates heaters for the respective zones.

The support may have any number of zones with any shapes defined for independent temperature control. For example, a circular support surface may have multiple zones defined concentrically. Each zone may further have multiple zones defined circumferentially. Each zone may have either the same number of zones or a different number of zones defined circumferentially. Each zone may have zones defined either at circumferentially same positions or at circumferentially different positions.

Figure 7A:
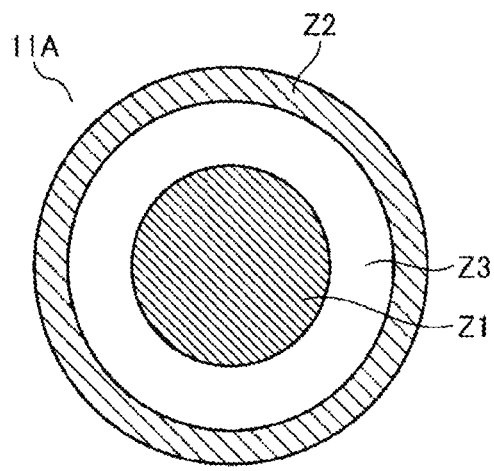
FIG. 7A is a diagram of a support having exemplary zones included in an etching apparatus according to the second embodiment.
Figure 7B:
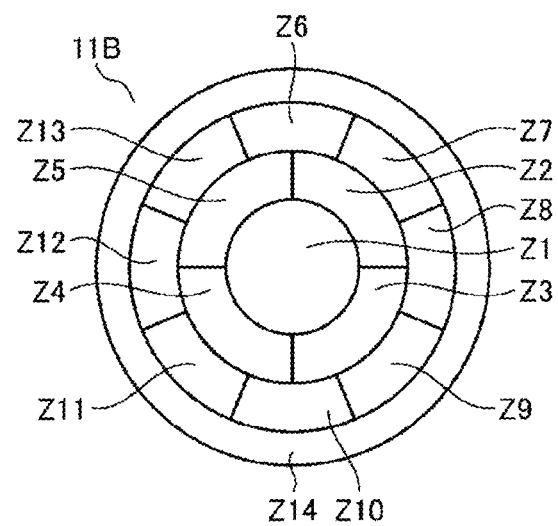
FIG. 7B is a diagram of the support having other exemplary zones included in the etching apparatus according to the second embodiment.
Figure 7C:
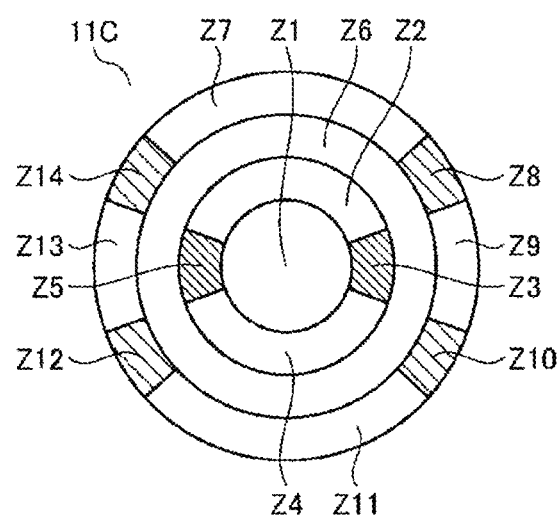
FIG. 7C is a diagram of the support having still other exemplary zones included in the etching apparatus according to the second embodiment.

FIGS. 7A to 7C are diagrams of exemplary zones in the support included in an etching apparatus according to the second embodiment. In the second embodiment, the support may have multiple zones defined to allow independent temperature control in each zone.

A support 11A shown in FIG. 7A has three zones. A first zone Z1 corresponds to a central portion of the substrate. A second zone Z2 corresponds to an edge portion of the substrate. A third zone Z3 corresponds to an annular portion between the central portion and the edge portion of the substrate. The first zone Z1, the second zone Z2, and the third zone Z3 may have any sizes.

A support 11B shown in FIG. 7B has 14 zones. The support 11B has four zones defined concentrically from the center toward the circumference. A circular first zone Z1 is located at the center. The first zone Z1 is surrounded by the separate quarters of a doughnut shape, or specifically, a second zone Z2, a third zone Z3, a fourth zone Z4, and a fifth zone Z5. The second to the fifth zones Z2 to Z5 are further surrounded by eight zones. The eight zones are a sixth zone Z6, a seventh zone Z7, an eighth zone Z8, a ninth zone Z9, a tenth zone Z10, an eleventh zone Z11, a twelfth zone Z12, and a thirteenth zone Z13. The sixth to the thirteenth zones Z6 to Z13 are further surrounded by an annular fourteenth zone Z14.

A support 11C shown in FIG. 7C also has 14 zones. The support 11C has four zones defined radially, and further has zones defined circumferentially. A first zone Z1 is a circular portion at the center. The annular portion surrounding the first zone Z1 has four circumferentially defined zones, which are a second zone Z2, a third zone Z3, a fourth zone Z4, and a fifth zone Z5. A sixth zone Z6, which is the second outermost peripheral portion, does not have circumferentially defined zones. The outermost peripheral portion has eight zones Z7 to Z14 defined circumferentially.

The zones of the supports shown in FIGS. 7A to 7C are mere examples. The supports may have other zones. The zones of the supports may correspond to the areas of the substrate. For example, a support may have a first zone corresponding to a first area of the substrate and a second zone corresponding to a second area of the substrate. In this case, the first area may include the center of the substrate, and the second area may include the edge of the substrate.

Controlling the temperature of the support across the surface of the support will now be described with reference to FIG. 7A. The zones shown in FIG. 7A are appropriate for a pattern that may vary between the central portion and the edge of the substrate. In film deposition and etching, for example, the film deposition amount and the etching amount may vary between the central portion and the edge portion of the substrate due to, for example, varying densities of plasma in the etching apparatus. In such a case, the support temperature is set low in areas with a larger film deposition amount and high in areas with a smaller film deposition amount.

FIG. 8 is a diagram showing exemplary conditions with the etching method according to the second embodiment. The conditions illustrated in FIG. 8 include the condition number, the support temperatures for the first zone, the second zone, and the third zone, and the processing conditions. The condition number is a unique number for identifying each set of conditions. The support temperatures refer to the temperatures of the respective zones of the support in the corresponding set of conditions. The support temperatures can be different values for the first, second, and third zones. The processing conditions refer to processing conditions other than the support temperatures. In the example of FIG. 8, the support temperatures associated with the condition number 1 are 10° C. for the first zone, 60° C. for the second zone, and 30° C. for the third zone. In this manner, the support temperatures can vary in areas from the center to the edge of the support.

Figure 9A:
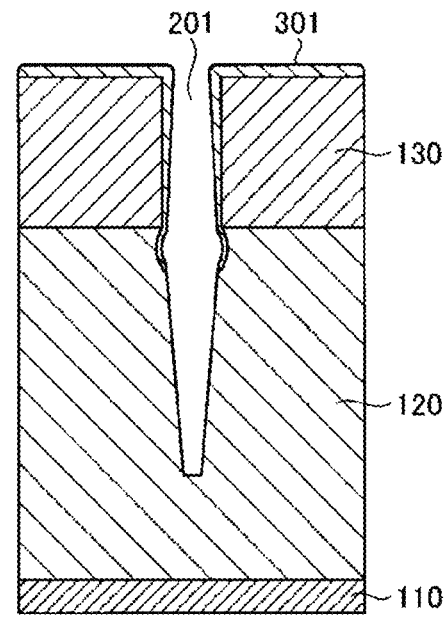
FIG. 9A is a diagram illustrating exemplary feature correction with the etching method according to the second embodiment.
Figure 9B:
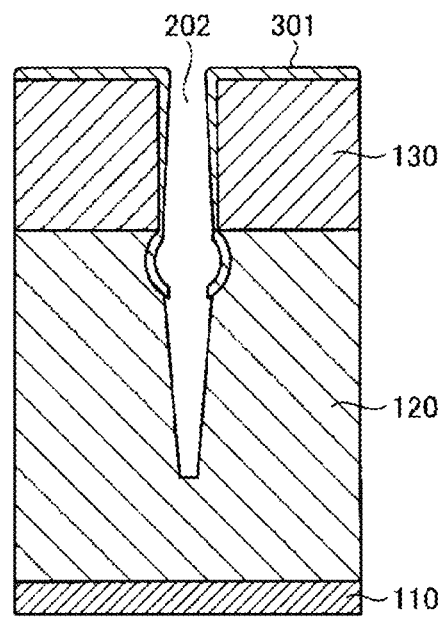
FIG. 9B is a diagram illustrating other exemplary feature correction with the etching method according to the second embodiment.

FIGS. 9A and 9B are diagrams each illustrating exemplary feature correction with the etching method according to the second embodiment. In FIG. 9A, a target film 120 and a mask 130 are formed on a substrate 110 in this order. A recess 201 is formed by etching. The recess 201 has bowing under the interface between the target film 120 and the mask 130. The recess 201 tapers and has a gradually narrower opening downward in the target film 120. A protective film 301 is formed through the same film deposition (step S102 in FIG. 1) as with the etching method according to the first embodiment.

A recess 202 in FIG. 9B expands more in the lateral direction than the recess 201 due to bowing. The lower end of the bowed portion shown in FIG. 9B is slightly lower than the lower end of the bowed portion shown in FIG. 9A. The protective film 301 in the recess 202 in FIG. 9B extends lower than the protective film 301 in the recess 201 in FIG. 9A. The protective film 301 is formed at this adjusted position with the adjusted film thickness distribution by setting the temperature of the support at the recess 202 differently from the support temperature set at the recess 201. In the examples of FIGS. 9A and 9B, the support temperature at the recess 201 is lower than the support temperature at the recess 202 to form the protective film 301 that extends over the lower end of the bowed portion in each of the recesses 201 and 202. The protective film 301 may be formed by chemical vapor deposition (CVD) or unsaturated ALD.

Advantageous Effects of Second Embodiment

The etching method according to the second embodiment above includes steps a), b), c), and d). Step a) includes placing, on a support, a substrate including a target film. Step b) includes partially etching the target film and forming a recess. Step c) includes setting temperatures of at least two of a plurality of zones of the support to different temperatures, and forming, on a sidewall of the recess, the film having different film thickness distributions in a depth direction in the at least two of the plurality of zones. Step d) includes partially further etching the target film having the film formed on the target film. As described above, controlling the support temperature to vary across the surface of the support allows formation of protective films with appropriate thickness distributions in different areas of the single substrate to reduce bowing that may occur at different positions of the target film in the film thickness direction in such areas during etching.

Example Structure of Etching Apparatus According to Embodiment

Figure 10:
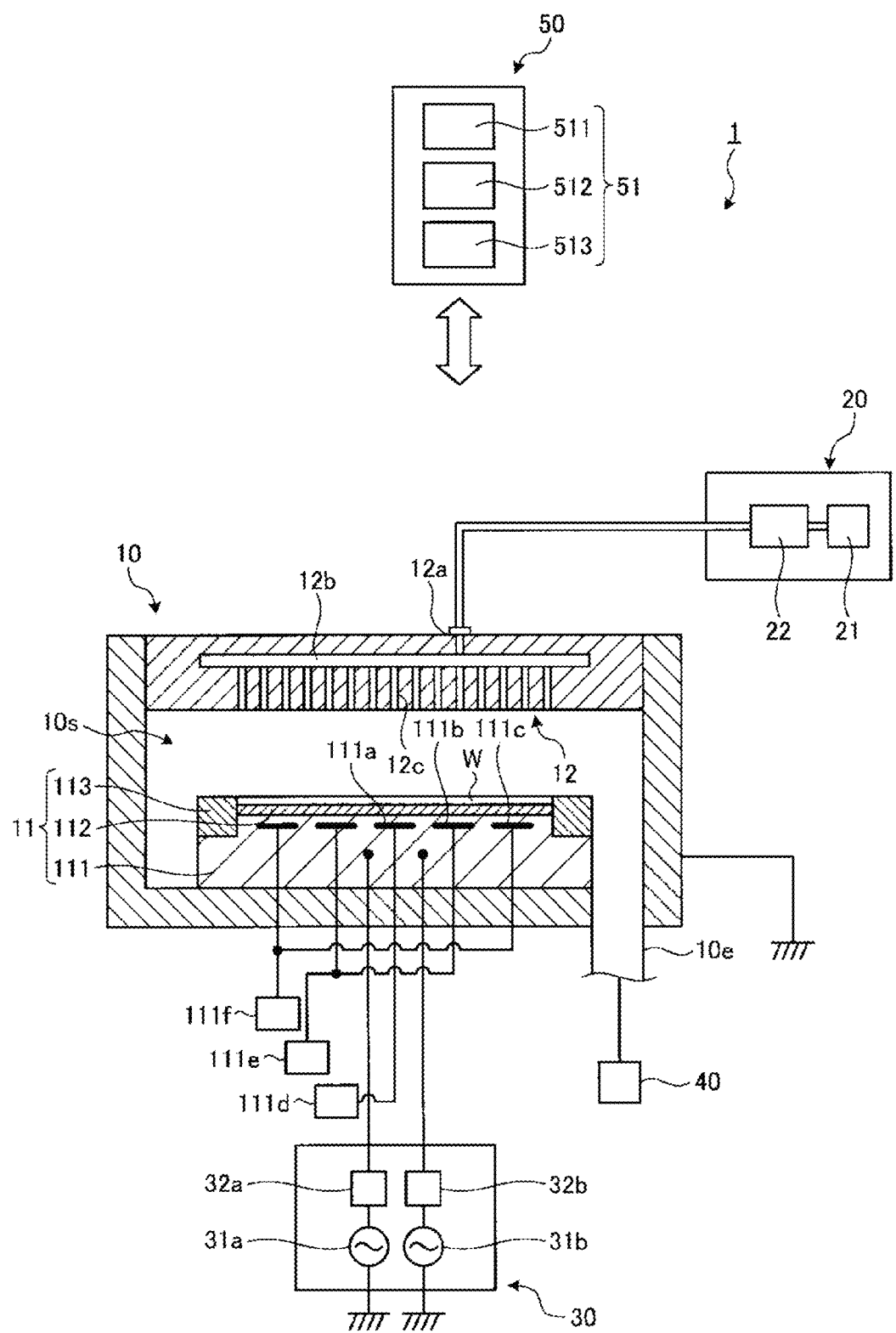
FIG. 10 is a diagram of an exemplary etching apparatus according to one embodiment.

FIG. 10 is a diagram of an exemplary etching apparatus according to one embodiment. An etching apparatus shown in FIG. 10 is a plasma processing apparatus. A plasma processing apparatus 1 shown in FIG. 10 includes a reaction chamber 10, a gas supply unit 20, an RF power supply unit 30, an exhaust system 40, and a controller 50.

In the present embodiment, the reaction chamber 10 includes a support 11 and an upper electrode shower head assembly 12. The support 11 is located in a lower portion of a processing space 10s within the reaction chamber 10. The upper electrode shower head assembly 12 is located above the support 11, and serves as a part of a ceiling plate of the reaction chamber 10.

The support 11 can support a substrate W in the processing space 10s. In the present embodiment, the support 11 includes a lower electrode 111, an electrostatic chuck (ESC) 112, and an edge ring 113. The ESC 112 is located on the lower electrode 111, and can support the substrate W on its upper surface. The edge ring 113 surrounds the substrate W on the upper periphery of the lower electrode 111. The surface of the support 11 that supports the substrate W has multiple zones defined to allow independent temperature control (refer to FIGS. 7A to 7C). The support 11 accommodates multiple heaters. In the example of FIG. 10, three heaters 111a, 111b, and 111c are arranged radially. Each of the heaters 111a, 111b, and 111c corresponds to one of the zones for heating the corresponding zone. The heaters can have any shapes and can be of any types. The heaters 111a, 111b, and 111c are respectively connected to temperature controllers 111d, 111e, and 111f.

The upper electrode shower head assembly 12 supplies one or more process gases from the gas supply unit 20 to the processing space 10s. In the present embodiment, the upper electrode shower head assembly 12 includes a gas inlet 12a, a gas-diffusion compartment 12b, and multiple gas outlets 12c. The gas inlet 12a allows passage of fluid to and from the gas supply unit 20 and the gas-diffusion compartment 12b. The gas outlets 12c allow communication of fluid with the gas-diffusion compartment 12b and the processing space 10s. In the present embodiment, the upper electrode shower head assembly 12 supplies one or more process gases from the gas inlet 12a through the gas-diffusion compartment 12b and the multiple gas outlets 12c into the processing space 10s.

The gas supply unit 20 may include one or more gas sources 21 and one or more flow controllers 22. In the present embodiment, the gas supply unit 20 supplies one or more process gases from the respective gas sources 21 via the respective flow controllers 22 to the gas inlet 12a. The flow controllers 22 may include a mass flow controller or a pressure-based flow controller. The gas supply unit 20 may further include one or more flow rate modulators that supply one or more process gases at a modulated flow rate or in a pulsed manner.

The RF power supply unit 30 provides RF power, or for example, one or more RF signals, to one or more electrodes, such as the lower electrode 111, the upper electrode shower head assembly 12, or both the lower electrode 111 and the upper electrode shower head assembly 12. In the present embodiment, the RF power supply unit 30 includes two RF generators 31a and 31b and two matching circuits 32a and 32b. The RF power supply unit 30 in the present embodiment provides a first RF signal from the first RF generator 31a via the first matching circuit 32a to the lower electrode 111. An RF spectrum includes a part of an electromagnetic spectrum in a range of 3 Hz to 3000 GHz. For electronic material processes such as semiconductor processes, an RF spectrum used to generate plasma may be within a range of 100 kHz to 3 GHz, or specifically, 200 kHz to 150 MHz. For example, the first RF signal may have a frequency of 27 to 100 MHz. The RF power supply unit 30 in the present embodiment provides a second RF signal from the second RF generator 31b via the second matching circuit 32b to the lower electrode 111. For example, the second RF signal may have a frequency of 400 kHz to 13.56 MHz. In place of the second RF generator 31b, a direct-current (DC) pulse generator may be used. Although not shown, other embodiments are also possible. For example, in some embodiments, the RF power supply unit 30 may provide the first RF signal from an RF generator to the lower electrode 111, the second RF signal from another RF generator to the lower electrode 111, and a third RF signal from still another RF generator to the lower electrode 111. In some other embodiments, a DC voltage may also be applied to the upper electrode shower head assembly 12. In various embodiments, the amplitude of one or more RF signals (such as the first RF signal or the second RF signal) may also be pulsed or modulated. Such amplitude modulation may include pulse-amplitude modulation of an RF signal between an on-state and an off-state, or between two or more different on-states. Phase matching of an RF signal may be controlled, and phase matching of amplitude modulation of two or more RF signals may be or may not be synchronized.

The exhaust system 40 may be connected to an outlet 10e located at the bottom of the reaction chamber 10. The exhaust system 40 may include a pressure valve, a turbomolecular pump, a roughing pump, or a vacuum pump combining these.

In the present embodiment, the controller 50 processes computer-executable instructions that cause the plasma processing apparatus 1 to perform various steps described above. The controller 50 may control the components of the plasma processing apparatus 1 to perform various steps described above. The controller 50 may include a computer 51. The computer 51 may include a central processing unit (CPU) 511, a storage 512, and a communication interface 513. The CPU 511 may perform various control operations in accordance with programs stored in the storage 512. The storage 512 may include at least one memory selected from the group consisting of a random-access memory (RAM), a read-only memory (ROM), and auxiliary storage devices including a hard disk drive (HDD) and a solid-state drive (SSD). The communication interface 513 may communicate with the plasma processing apparatus 1 through a communication line such as a local area network (LAN).

As described above, the apparatus according to the embodiment is an etching apparatus and includes a reaction chamber with a processing space. The etching apparatus includes a support accommodated in the reaction chamber. The support includes multiple zones for which temperatures are independently controllable. The support includes a support surface onto which a substrate is placeable. The etching apparatus includes a gas supply unit to supply a process gas into the reaction chamber. The etching apparatus includes a controller to control temperatures of multiple zones and an operation of the gas supply unit. The controller causes components to perform an etching method. The etching method includes a) placing, on a support, a substrate including a target film. The etching method includes b) partially etching the target film and forming a recess. The etching method includes c) setting the temperature of the support at a first temperature, and forming, on a sidewall of the recess, a first film having a first film thickness distribution. The etching method includes d) partially further etching the target film having the first film formed on the target film. The etching method includes e) setting the temperature of the support at a second temperature different from the first temperature, and forming, on the sidewall of the recess, a second film having a second film thickness distribution different from the first film thickness distribution.

The embodiments described above are mere examples and are not intended to limit the scope of the present disclosure.

Various additions, omissions, substitutions, and changes may be made without departing from the spirit of the present disclosure.

REFERENCE SIGNS LIST

1 Plasma processing apparatus
10 Reaction chamber
10e Outlet
10s Processing space
11 Support
111 Lower electrode
111a, 111b, 111c Heater
111d, 111e, 111f Temperature controller
112 Electrostatic chuck (ESC)
113 Edge ring
12 Upper electrode shower head assembly
12a Gas inlet
12b Gas-diffusion compartment
12c Gas outlet
20 Gas supply unit
21 Gas source
22 Flow controller
30 Radio-frequency (RF) power supply unit
31a, 31b First and second RF generator
32a, 32b First and second matching circuit
40 Exhaust system
50 Controller
51 Computer
511 Central processing unit
512 Storage
513 Communication interface
W Substrate

What is claimed is:

1. An etching method, comprising:
   a) placing a substrate on a support, the substrate including a target film;
   b) partially etching the target film and forming a recess therein by a plasma generated from a first gas;
   c) setting a temperature of the support at a first temperature after performing the partial etching, and forming a first film on a sidewall of the recess by introduction of a second gas different from the first gas, the first film having a first film thickness distribution;
   d) partially further etching the target film after the first film has been formed on the recess of the target film by a plasma generated from a third gas different from the second gas; and
   e) setting the temperature of the support at a second temperature different from the first temperature after the partially further etching, and forming a second film on the sidewall of the recess by introduction of a fourth gas different from the third gas, the second film having a second film thickness distribution different from the first film thickness distribution.

2. The etching method according to claim 1, wherein the second temperature is higher than the first temperature.

3. The etching method according to claim 2, wherein the forming the first film comprising:
   adjusting a temperature of a first zone of the support corresponding to a first area of the substrate to a temperature different from a temperature of a second zone of the support corresponding to a second area of the substrate to form the first film in the first area to have at least one of a thickness or a position different from a thickness and a position of the first film formed in the second area.

4. The etching method according to claim 3, wherein the first area includes a center of the substrate, and the second area includes an edge of the substrate.

5. The etching method according to claim 4, wherein
   c) includes
   c-1) supplying a first reactant and causing the first reactant to be adsorbed on the side wall of the recess, and
   c-2) supplying a second reactant and causing the second reactant to react with the first reactant to form the first film,
   e) includes
   e-1) supplying a third reactant and causing the third reactant to be adsorbed on the sidewall of the recess, and
   e-2) supplying a fourth reactant and causing the fourth reactant to react with the third reactant to form the second film, and
   c-2) is performed for a duration different from a duration of e-2) so as to form the first film to have at least one of a thickness or a position different from a corresponding thickness or position of the second film.

6. The etching method according to claim 5, wherein the first film thickness distribution varies in at least one of a thickness direction or a radial direction of the substrate.

7. The etching method according to claim 5, wherein the second film thickness distribution varies in at least one of a thickness direction or a radial direction of the substrate.

8. The etching method according to claim 7, wherein the target film includes a silicon-containing layer.

9. The etching method according to claim 8, wherein the substrate includes a carbon-containing mask on the target film.

10. The etching method according to claim 1, wherein the forming the first film further comprising:
    adjusting a temperature of a first zone of the support corresponding to a first area of the substrate to a temperature different from a temperature of a second zone of the support corresponding to a second area of the substrate to form the first film in the first area to have at least one of a thickness or a position different from a thickness and a position of the first film formed in the second area.

11. The etching method according to claim 10, wherein the first area includes a center of the substrate, and the second area includes an edge of the substrate.

12. The etching method according to claim 1, wherein the first film thickness distribution varies in at least one of a thickness direction or a radial direction of the substrate.

13. The etching method according to claim 1, wherein the second film thickness distribution varies in at least one of a thickness direction or a radial direction of the substrate.

14. The etching method according to claim 1, wherein the target film includes a silicon-containing layer.

15. The etching method according to claim 1, wherein the substrate includes a carbon-containing mask on the target film.

16. The etching method according to claim 1, further comprising:
    repeating b), c), d), and e) until the recess has an aspect ratio of at least 40.

17. The etching method according to claim 1, wherein the first film and the second film have a same composition.

18. An etching method, comprising:
a) placing a substrate on a support the substrate including a target film;
b) partially etching the target film and forming a recess therein;
c) setting a temperature of the support at a first temperature, and forming a first film on a sidewall of the recess, the first film having a first film thickness distribution:
d) partially further etching the target film after the first film has been formed on the recess of the target film; and
e) setting the temperature of the support at a second temperature different from the first temperature, and forming a second film on the sidewall of the recess, the second film having a second film thickness distribution different from the first film thickness distribution wherein
  c) includes
    c-1) supplying a first reactant and causing the first reactant to be adsorbed on the sidewall of the recess, and
    c-2) supplying a second reactant and causing the second reactant to react with the first reactant to form the first film,
  e) includes
    e-1) supplying a third reactant and causing the third reactant to be adsorbed on the sidewall of the recess, and
    e-2) supplying a fourth reactant and causing the fourth reactant to react with the third reactant to form the second film, and
  c-2) is performed fir a duration different from a duration of e-2) so as to form the first film to have at least one of a thickness or a position different from a corresponding thickness or position of the second film.

19. An etching method, comprising:
a) placing a substrate on a support, the substrate including a target film;
b) partially etching the target film and forming a recess therein by a plasma generated from a first gas;
c) setting temperatures of at least two of a plurality of zones of the support to different temperatures after performing the partial etching, and forming a film on a sidewall of the recess by introduction of a second gas different from the first gas, the film having different film thickness distributions, in a depth direction, in areas corresponding with the at least two of the plurality of zones; and
d) partially further etching the target film after the film has been formed on the recess of the target film by a plasma generated from a third gas different from the second gas.

* * * * *